United States Patent [19]

Neale

[11] 3,775,174

[45] Nov. 27, 1973

[54] FILM DEPOSITED CIRCUITS AND DEVICES THEREFOR

[75] Inventor: Ronald G. Neale, Birmingham, Mich.

[73] Assignee: Energy Conversion Devices, Inc., Troy, Mich.

[22] Filed: May 20, 1971

[21] Appl. No.: 145,286

Related U.S. Application Data

[62] Division of Ser. No. 773,013, Nov. 4, 1968, Pat. No. 3,629,863.

[52] U.S. Cl. .............. 117/212, 117/217, 317/234 S

[51] Int. Cl. .............................................. H01l 11/00

[58] Field of Search.................... 117/212, 215, 217; 29/622, 590; 317/234 S, 234 V

[56] References Cited

UNITED STATES PATENTS

| | | | |
|---|---|---|---|
| 3,271,591 | 9/1966 | Ovshinsky | 307/258 |
| 3,395,446 | 8/1968 | Jensen | 317/234 V |
| 3,377,566 | 4/1968 | Lanza | 317/234 V |
| 3,505,572 | 4/1970 | Yamashita et al. | 317/234 S |
| 3,395,040 | 7/1968 | Pritchard et al. | 117/212 |
| 3,611,063 | 10/1971 | Neale | 317/234 V |
| 3,654,531 | 4/1972 | Krambeck et al. | 317/234 V |
| 3,517,336 | 6/1970 | Symanski | 317/234 V |

*Primary Examiner*—Ralph S. Kendall
*Attorney*—Wallenstein, Spangenberg, Hattis & Strampel

[57] ABSTRACT

A method comprising depositing on an insulating base conductive materials forming the passive elements of said electrical circuit and conductors extending thereto, and depositing on said insulating base at least one layer of semiconductor material forming said semiconductor device which electrically connects with at least one of said conductors.

2 Claims, 6 Drawing Figures

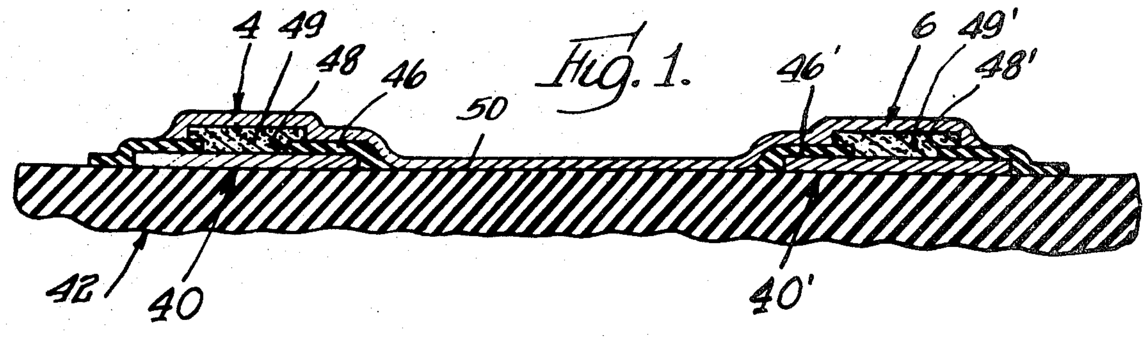
Fig. 1.
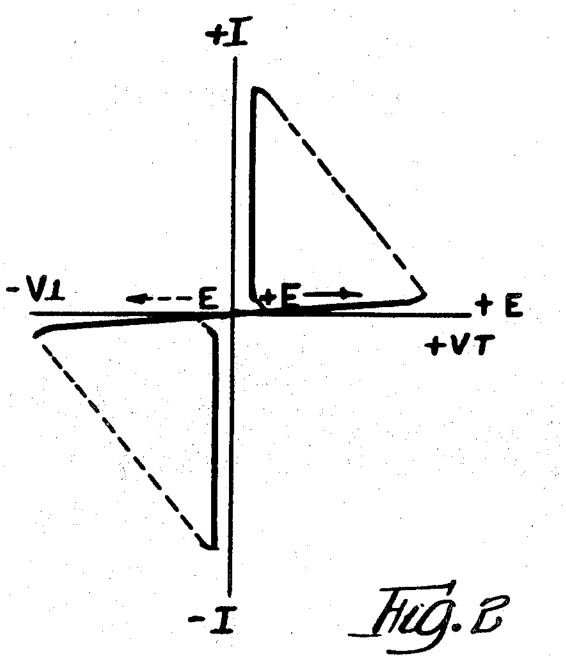
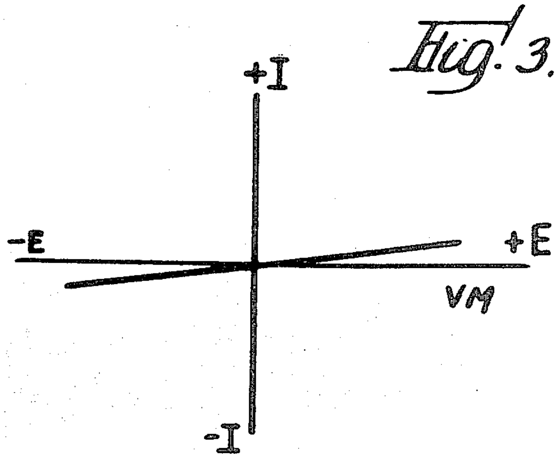
Fig. 2, Fig. 3.
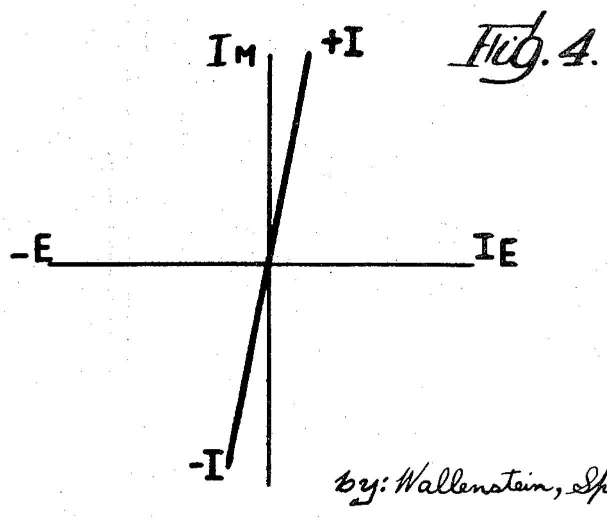
Fig. 4.
INVENTOR
RONALD G. NEALE
by: Wallenstein, Spangenberg, Hattis & Strampel
ATTYS.

PATENTED NOV 27 1973

3,775,174

INVENTOR
RONALD G. NEALE
by: Wallenstein, Spangenberg, Hattis & Strampel
ATTYS.

FILM DEPOSITED CIRCUITS AND DEVICES THEREFOR

This application is a division of application Ser. No. 773,013, filed Nov. 4, 1968, now Pat. No. 3,629,863.

In accordance with the invention, a complete circuit including current control devices like threshold and memory switch devices in U. S. Pat. No. 3,271,591, granted on Sept. 6, 1966, to S. R. Ovshinsky, and passive electrical circuit elements can be fabricated as film deposits on any suitable insulating base so the entire circuit can be compactly made by inexpensive, mass production, batch fabrication techniques. The manufacture of complete circuit including current control devices like the transistors, silicon controlled rectifiers and the like by depositing these and other circuit elements as films on a common insulating base has only heretofore been accomplished with much difficulty.

One form of deposited film threshold switch device disclosed in said U. S. Pat. No. 3,271,591, is a two-terminal device formed by a layer of semiconductor material which switches from a normally high resistance to a low resistance condition when the voltage applied to the opposite surface thereof exceeds some threshold value, and reverts to the high resistance state when the current flow therethrough falls below some minimum value. Semiconductor materials forming such threshold switch device are disclosed in said U. S. Pat. No. 3,271,591. Such threshold switch devices can be fabricated with a wide selection of threshold levels of modest values, e.g., 5–30 volts, merely by controlling the thickness of the semiconductor films involved. The film deposited memory switch device used in the memory matrix referred to is a two-terminal bistable device formed by a layer of semiconductor material which is triggered into a low resistance condition when a voltage applied to the opposite surfaces of this layer exceeds a given threshold value. The semiconductor layer then remains indefinitely in its low resistance condition even when the applied voltage is removed, until reset to a high resistance condition as by feeding a relatively large reset current therethrough at a voltage below said threshold value. Semiconductor materials forming memory switch devices may be of the type disclosed in said U. S. Pat. No. 3,271,591. It is believed that the semiconductor materials of the threshold and memory switch devices generally conduct current along a filamentous path or paths extending between the surfaces to which the voltage is applied. While for purposes of illustration, reference is made to switch devices of the type disclosed in U. S. Pat. No. 3,271,591, other switch devices having threshold and memory switching characteristics, respectively, similar to those of the devices of the patent may be utilized in the matrix of this invention.

The above mentioned deposited film threshold and memory switch devices are associated with deposited passive circuit elements like capacitors and resistors on a common insulating base to form an integrated circuit which can be mass produced by batch fabrication techniques.

The above and other advantages and features of the invention will become more apparent upon making reference to the specification to follow, the claims and the drawings wherein:

FIG. 1 is a view of a pair of series connected, deposited film switch devices on an insulating base which may also include deposited film passive circuit elements;

FIG. 2 is a voltage-current characteristic of the threshold switch device shown in FIG. 1;

FIG. 3 is a voltage-current characteristic of the memory switch device shown in FIG. 1 when the device is in its high resistance condition;

FIG. 4 shows the voltage-current characteristic of memory switch device of FIG. 1 when the device is in its low resistance condition;

Figure 5:
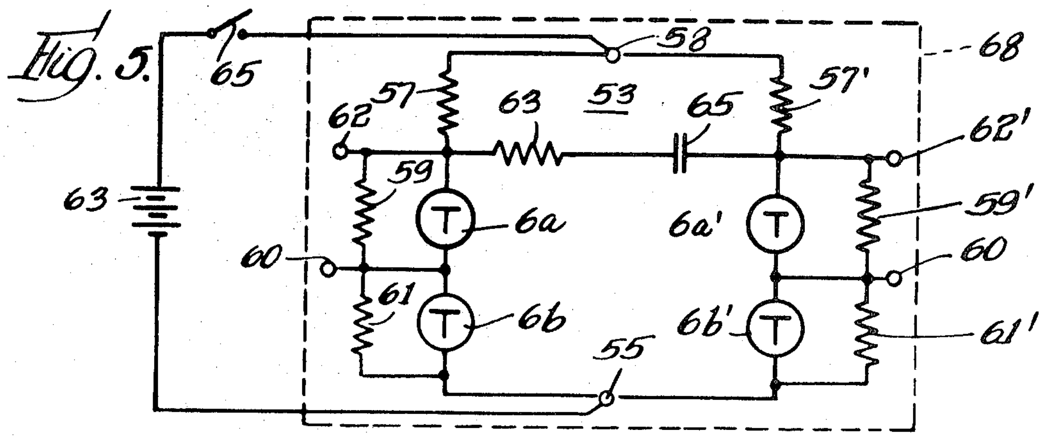
FIG. 5 is a circuit diagram of a basic control circuit which can be completely made by deposited film threshold switch devices, resistors and capacitors on an insulating board in accordance with the present invention.

The deposited film threshold switch device used in the present invention includes a film or layer of semiconductor material which is a substantially disordered and generally amorphous material in both its high resistance and low resistance conditions. The material has local order and localized bonding and is made so that any tendency to alter the local order or localized bonding is minimized upon changes between the high resistance and low resistance conditions. However, in some cases, crystalline semiconductor materials can be used for these films or layers. Many examples of such semiconductor materials are described in the aforesaid patent. Typical voltage-current characteristics of these threshold switch devices are shown in FIG. 2.

The memory switch device which may be of the type disclosed in the aforementioned patent includes a film or layer of semiconductor material 16 which is also a substantially disordered and generally amorphous semiconductor material which has local order and localized bonding in its high resistance condition. However, in contrast to the threshold switch device materials, the memory switch type material is made so that the local order and localized bonding thereof can be altered to establish a conducting path or paths therethrough in a quasi permanent manner. In other words, the conductivity of the material may be drastically altered to provide a conducting path or paths in the material which is frozen in. The conducting path or paths may be realtered to substantially the original conditions by means of a relatively short duration current reset pulse. FIG. 3 shows a typical voltage-current characteristic of the memory switch device in its high resistance condition and FIG. 4 shows that characteristic of the memory switch devices and the memory switch devices of the aforementioned patent have symmetrical switching characteristics with respect to the polarity of the applied voltage, and, therefore, these switch devices operate in the same manner regardless of the polarity of the applied voltages. However, as expressed above other switch devices, which do not have symmetrical switching characteristics, may be utilized in the memory matrix disclosed herein.

A typical range of low resistance values for a threshold switch device of the type disclosed in the aforementioned patent is 1 to 1,000 ohms and a typical range of high resistance values for such a device is 10 to 1,000 megohms. A typical range of low resistance values for a memory switch device of the type disclosed in that patent is 1 to 1,000 ohms and a typical range of high resistance values for such a device is 10 to 1,000 megohms.

In the operation of both the threshold and memory switch devices, the switch-over between high resistance and low resistance conditions and vice versa is substantially instantaneous and occurs along a path or paths between the conductive electrodes applied to the opposite sides of the film or layer of semiconductor material involved. The semiconductor materials disclosed in the aforesaid patent are bidirectional so that the switch-over occurs independently of the polarity of the applied voltage. It should be noted from an examination of FIG. 3 that, in the low resistance condition of the memory switch device, the current conduction is substantially ohmic so there is an increase in voltage drop thereacross with an increase of current flow therethrough. In some instances, however, it has been observed that current conduction of the memory switch device takes place at a substantially constant voltage drop across the device at relatively high current levels, although it is ohmic at lower current levels. In contrast to this, in the threshold switch devices, as shown in FIG. 2, the voltage drop across the threshold switch device remains substantially constant over a wide range of current levels. The switching of a memory switch device from a low resistance to a high resistance condition can be achieved by applying a reset current at or above a reset level at a voltage below the threshold value of the device.

As previously indicated, unlike the threshold switch device which remains in its low resistance condition only so long as the current flowing therethrough is above a current holding level, the memory switch device remains indefinitely in its low resistance condition even when the current flow therethrough is terminated and the applied voltage removed therefrom.

Reference should now be made to FIG. 1 showing the most preferred physical form of the deposited film form of the threshold and memory switch device. An insulating base 42 of any suitable insulating material has applied thereto by silkscreening or other means the spaced parallel conductors 40 and 40'. Over conductors 40 and 40' are deposited layers 46 and 46' of a suitable insulating material. A memory switch device 4 and a threshold switch device 6 are respectively deposited as films over the spaced conductors 40 and 40'. The path of current flow through a threshold or memory switch device is believed to occur in a limited path or filament in the body of semiconductor material. To ensure consistant conducting characteristics in such a device, it is believed important to constrain the flow of current through the same region and preferably the same path or filament of the body of semiconductor material each time the device carries current. To this end, as illustrated in the drawings, the layers 46 and 46' of insulating material respectively have pores or small holes 48 and 48' therein so that only a small portion of the outer surface of the conductors 40 and 40' are exposed for application of respective films or layers 49 and 49' of semiconductor material. The film 49 of semiconductor material is a memory switch device-forming material deposited over and within the port 48, and the film 49' of semiconductor material is a threshold switch device-forming material deposited over and within the pore 48', whereby these films of semiconductor material make contact with the underlying conductors over small areas. For example, the width of each pore 48 and 48' and hence the area of contact referred to may be in the range of from about 10 to 100 microns, preferably about 10 microns in the most preferred form of the invention. The semiconductor material of each memory switch device can be applied by sputtering, vacuum deposition of silk screening techniques.

Figure 6:
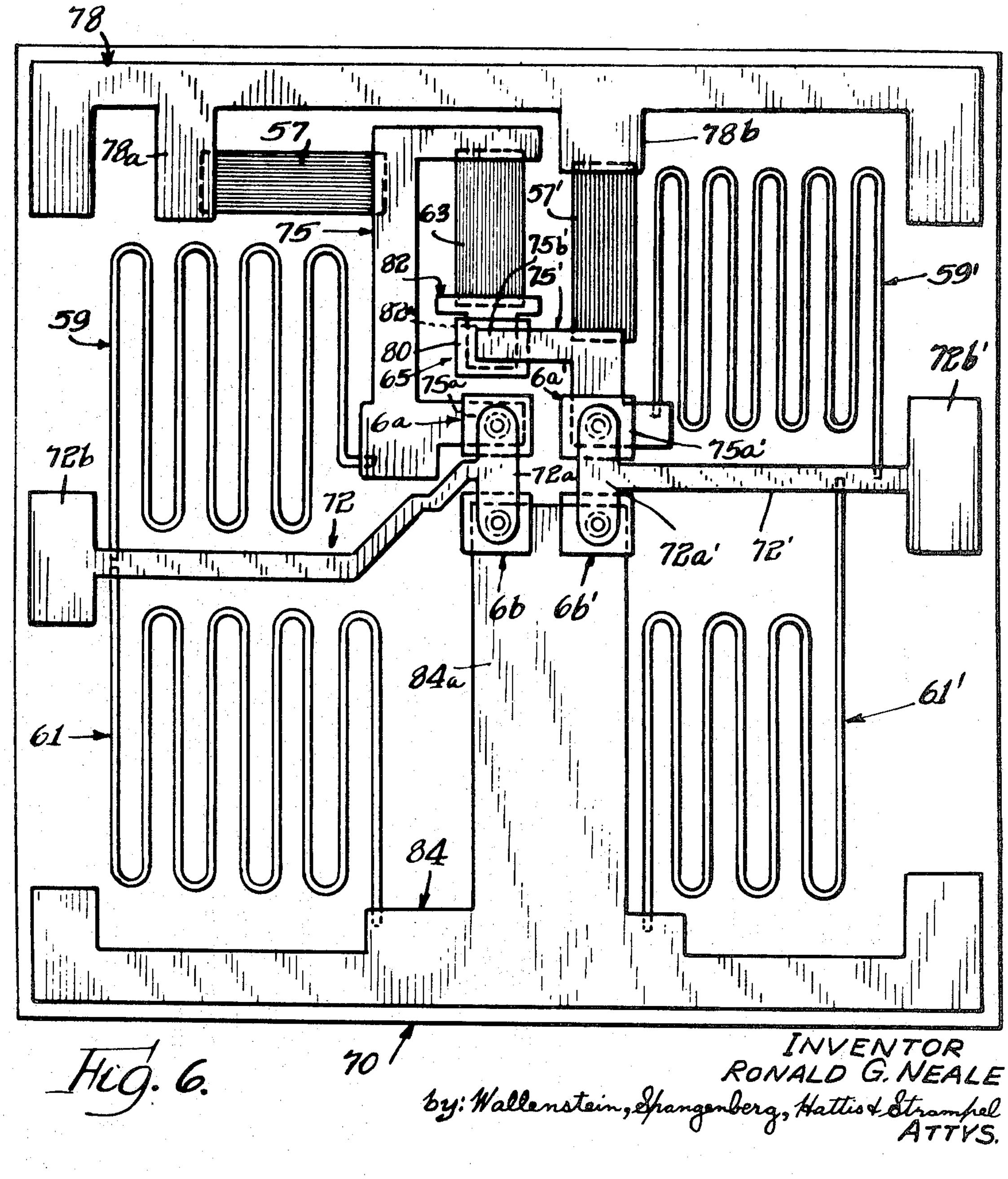
FIG. 6 illustrates a circuit board having all the elements of the circuit of FIG. 5 as film deposits thereon.

Refer now to FIG. 5 which is a schematic diagram of the film deposited circuit 53 shown in FIG. 6. The circuit is a bistable circuit including a pair of threshold switch devices *6a–6b* connected in series between terminal 55 and one end of a resistor 57, the other end of which is connected to a terminal 58. A pair of resistors 59 and 61 are respectively connected across the terminals of the threshold switch devices *6a–6b*. A signal input terminal 60 is connected to the juncture of the threshold switch device *6a–6b*. The circuit 53 further includes another pair of threshold switch devices *6a'–6b'* which are connected in series between the terminal 55 and one end of a resistor 57', the other end of which is connected to terminal 58. Resistors 59' and 61' are respectively connected across the terminals of the threshold switch devices *6a'–6b'*. Output terminals 62 and 62' are respectively connected to the junctures of the threshold switch devices 6 *a'–6a* and resistors 57–57'. The terminals of a source of DC voltage 63 are connected through an on-off switch 65 without concern for the polarity connections respectively to the terminals 55 and 58. In the exemplary circuit 53, the threshold value of each of the threshold switch devices *6a*, *6a'*, *6b* and *6b'* were in the range of from 6 to 10 volts and the output of the source of DC voltage 63 was in a range of about 8 to 15 volts. The voltage appearing across the terminals of any one of the threshold switch devices in the absence of an external signal voltage is insufficient to drive the threshold switch devices into a low resistance condition.

A selected pair of threshold switch devices is driven into a conductive state by the feeding of a voltage between one of the signal input terminals 60 and 60' and the terminal 55 which exceeds the threshold value thereof to drive the threshold switch device *6b* or *6b'* into its low resistance condition. The value of the resistors 59–61 and 59'–61' are preferably 10 or more times the value of resistors 57 and 57' so that the firing of the threshold switch device *6b* or *6b'* will result in the presence of substantially the entire output of the source of DC voltage 62 across the associated threshold switch device *6a* or *6a'* to drive the same into its low resistance condition. The pair of threshold switch devices involved are thusly driven practically simultaneously into conductive states to suddenly cause a sharp reduction in the voltage at the associated output terminal 62 or 62'. Part of the sudden drop of voltage is coupled through a resistor 63 and a capacitor 65 to the other pair of threshold switch devices which, if they were already in their low resistance conditions, would be driven to their high resistance condition. The conductive conditions of the pairs of threshold switch devices thus can be reversed by the feeding of a firing voltage to the signal input terminal 60 or 60' associated with the pair of threshold switch devices which are in a high resistance condition at any instant.

Referring now to FIG. 6, all the circuit elements enclosed by dotted lines 68 in FIG. 5, namely all the circuit elements but the on-off switch 65 and the source of DC voltage 63, are shown as film deposits on an insulating base 70. The size of the film deposited circuit shown in FIG. 12 is greatly magnified. For example, the size of the insulating base 70 thereshown may be of a ½ inch square or smaller. The various film deposited circuit elements shown in FIG. 6 are identified by the same reference numerals used to identify the same in FIG. 5. Each of the threshold switch devices 6*a*, 6*b*, 6*a*′, 6*b*′ may be a series of layers of conductor and semiconductor materials substantially identical to that of the threshold switch devices 6 shown in FIGS. 8 through 10, and thus a further description of these layers will not now be given. The upper electrode of the threshold switch devices 6*a* and 6*b* are formed by an extension 72*a*′ of layer 72 of highly conductive material which also connects the threshold switch devices 6*a*–6*b* in series. The layer 72 of conductive material has another extension 72*b* which may form the aforementioned signal input terminal 60. A layer 72′ of highly conductive material is provided having an inner extension 72*a*′ which forms the outer electrodes for the threshold switch devices 6*a*′ and 6*b*′ and connects the same in series, and an outer extension 72*b*′ which forms the signal input terminal 60′. The bottom electrode of the threshold switch device 6*a* is formed by the extension 75*a* of a layer 75 of conductive material. The layer of conductive material 75 overlies one of the ends of resistor-forming deposits constituting the resistors 57, 59 and 63. Resistors 57 and 63 (as well as resistor 57′) may be of relatively small value (e.g. 1,500 ohms) and thus are shown as rectangular-shaped deposits of resistorforming material while resistor values many times this value (e.g. 100,000 ohms) and are, therefore, shown as narrow zig-zagging deposits of resistor-forming material. The other end of the resistor-forming deposit forming the resistor 59 is overlayed by a portion of the layer 72 of conductive material. The other end of the resistor-forming deposit forming the resistor 57 is overlayed by an extension 78*a* of a bus-forming layer 78 of highly conductive material.

The bottom electrode of the threshold switch device 6*a*′ is formed by an extension 75*a*′ of a layer 75′ of conductive material which also overlays one end of a rectangular deposit of resistor-forming material forming the resistor 57′. The other end of the resistor 57′ is overlaid by an extension 78*b* of the layer 78 of conductive material. The extension 75*a*′ of the layer 75′ of conductive material also overlays one end of a narrow zig-zagging deposit of resistor-forming material constituting the resistor 59′. The other end of the resistor 59′ is overlaid by the layer 72′ of conductive material.

The layer 75′ of conductive material forming the bottom electrode of the threshold switch device 6*a*′ has an extension 75*b*′ which overlies a layer 80 of insulating material forming the dielectric of the capacitor 65 and forms one of the plates of the capacitor 65. The layer 80 of insulating material is deposited over an extension 82*a* of a layer 82 of highly conductive material deposited on the insulating base 70, which extension 82*a* constitutes the bottom plate of the capacitor 65. The layer 82 of conductive material overlays the other end of the layer of resistor-forming material constituting the resistor 63. The opposite ends of the layer of resistor-forming material constituting the resistor 57′ are overlaid respectively by portions of the layer 75′ and the layer 78 of conductive material. The bottom electrodes of the threshold switch devices 6*b* and 6*b*′ are formed by an extension 84*a* of a layer 84 of highly conductive material deposited on the insulating base 70. The opposite ends of a narrow zig-zagging deposit of resistor-forming material constituting the resistor 61′ are respectively overlaid by the layer 84 and the layer 72′ of conductive material, as shown. Similarly, the end of the zig-zagging deposite of resistor-forming material constituting the resistor 61 are respectively overlaid by portions of the layer 72 and 84 of conductive material. The energizing voltage input terminals 58 and 55 in FIG. 5 may be constituted by any portion of the layers 78 and 84 of conductive material to which external connections can be conveniently made. The output terminals 62 and 62′ may be formed by any portion of the layer 75 and 75′ of conductive material to which external connections may be conveniently made.

It is apparent that the present invention enable complete circuits to be formed by simple film deposits on one side of a base of insulating material so that entire circuits can be made simply and economically by automatic, mass production machines.

It should be understood that numerous modifications may be made in the specific forms of the invention disclosed in the drawings and described above without deviating from the broader aspects of the invention.

I claim:

1. A method of making an electrical circuit including a number of electrical impedance-forming passive circuit elements and a number of semiconductor current control devices each of which can be rendered conductive when a voltage applied thereto exceeds a given threshold voltage value, said method comprising the steps of depositing on an insulating base films of conductive material forming said impedance-forming passive elements and conductors extending thereto, and depositing over the conductor-forming films of conductive materials on said insulating base films of semiconductor material forming said semiconductor devices which semiconductor material electrically connects various ones of said conductors, and then depositing conductor-forming films over the outer surfaces of said deposited films of semi-conductuor material to form electrical connections thereto wherein the impedance-forming passive circuit elements and semiconductor current control devices are interconnected to form a substantially all-film electrical circuit.

2. A method of making an electrical circuit including a number of electrical impedance-forming passive circuit elements and a number of semiconductor current control devices each of which can be rendered conductive when a voltage applied thereto exceeds a given threshold voltage value, said method comprising the steps of depositing on an insulating base films of conductive material forming said impedance-forming passive elements and conductors extending thereto depositing films of insulating material over the conductor-forming portions of said deposits of conductive material on said insulting base, each of said films of insulating materials having a hole in the same, and depositing over the holes of said films of insulating material films of semiconductor material forming said semiconductor devices which semiconductor material electrically connects various ones of said conductors through said holes, wherein the impedance-forming passive circuit elements and semiconductor current control devices are interconnected to form a substantially all-film electrical circuit.

* * * * *